United States Patent
Maezawa et al.

(10) Patent No.: US 10,576,539 B2
(45) Date of Patent: Mar. 3, 2020

(54) FLAT SOFT MAGNETIC POWDER AND PRODUCTION METHOD THEREFOR

(71) Applicant: Sanyo Special Steel Co., Ltd., Himeji-shi (JP)

(72) Inventors: Fumihiro Maezawa, Himeji (JP); Toshiyuki Sawada, Himeji (JP)

(73) Assignee: Sanyo Special Steel Co., Ltd., Hyogo (JP)

(*) Notice: Subject to any disclaimer, the term of this patent is extended or adjusted under 35 U.S.C. 154(b) by 349 days.

(21) Appl. No.: 15/558,250

(22) PCT Filed: Mar. 8, 2016

(86) PCT No.: PCT/JP2016/057093
§ 371 (c)(1),
(2) Date: Sep. 14, 2017

(87) PCT Pub. No.: WO2016/147943
PCT Pub. Date: Sep. 22, 2016

(65) Prior Publication Data
US 2018/0043430 A1    Feb. 15, 2018

(30) Foreign Application Priority Data

Mar. 17, 2015 (JP) .................. 2015-052940

(51) Int. Cl.
| | |
|---|---|
| *B22F 1/00* | (2006.01) |
| *C22C 38/02* | (2006.01) |
| *B22F 9/10* | (2006.01) |
| *B22F 9/08* | (2006.01) |
| *C22C 38/06* | (2006.01) |
| *C22C 33/02* | (2006.01) |
| *H05K 9/00* | (2006.01) |
| *C22C 38/00* | (2006.01) |
| *B22F 9/04* | (2006.01) |
| *H01F 1/20* | (2006.01) |
| *H01F 1/147* | (2006.01) |
| *B22F 3/18* | (2006.01) |
| *B22F 5/00* | (2006.01) |

(52) U.S. Cl.
CPC .......... *B22F 1/0055* (2013.01); *B22F 1/0081* (2013.01); *B22F 1/0085* (2013.01); *B22F 1/0088* (2013.01); *B22F 9/04* (2013.01); *B22F 9/082* (2013.01); *B22F 9/10* (2013.01); *C22C 33/0278* (2013.01); *C22C 38/002* (2013.01); *C22C 38/02* (2013.01); *C22C 38/06* (2013.01); *H01F 1/14791* (2013.01); *H01F 1/20* (2013.01); *H05K 9/0081* (2013.01); *B22F 3/18* (2013.01); *B22F 5/006* (2013.01); *B22F 2998/10* (2013.01); *B22F 2999/00* (2013.01); *C22C 2202/02* (2013.01)

(58) Field of Classification Search
CPC .. B22F 1/0055; B22F 1/0085; H01F 1/14791; H01F 1/20
See application file for complete search history.

(56) References Cited

U.S. PATENT DOCUMENTS 8,123,972 B2    2/2012    Aramaki et al.

FOREIGN PATENT DOCUMENTS

| | | | |
|---|---|---|---|
| CN | 101536121 | A | 9/2009 |
| JP | 2003332113 | A | 11/2003 |
| JP | 2005116819 | A | 4/2005 |
| JP | 2005-123531 | * | 5/2005 |
| JP | 2005123531 | A | 5/2005 |
| JP | 2005243895 | A | 9/2005 |
| JP | 200850644 | A | 3/2008 |
| JP | 2009266960 | A | 11/2009 |
| JP | 4636113 | B2 | 2/2011 |
| JP | 201122661 | A | 2/2011 |

OTHER PUBLICATIONS

Translation of JP 2005-123531, May 12, 2005.*

* cited by examiner

*Primary Examiner* — C Melissa Koslow

(57) ABSTRACT

Provided is a flaky soft magnetic powder including an Fe—Si—Al alloy having an oxygen content of 0.6 mass % or less, a manganese content of 0.1 mass % to 1.0 mass %, and the balance incidental impurities. The flaky soft magnetic powder has an average particle size of 43 to 60 μm and exhibits a coercive force Hc of 106 A/m or less as measured under application of a magnetic field in an in-plane direction of the flaky soft magnetic powder. The ratio of the tap density to the true density of the flaky soft magnetic powder is 0.17 or less. Also provided is a method of producing the flaky soft magnetic powder. The use of the flaky soft magnetic powder can produce a magnetic sheet having particularly high magnetic permeability.

9 Claims, No Drawings

FLAT SOFT MAGNETIC POWDER AND PRODUCTION METHOD THEREFOR

CROSS-REFERENCE TO RELATED APPLICATIONS

This application is the United States national phase of International Application No. PCT/JP2016/057093 filed Mar. 8, 2016, and claims priority to Japanese Patent Application No. 2015-052940 filed Mar. 17, 2015, the disclosures of which are hereby incorporated in their entirety by reference.

TECHNICAL FIELD

The present invention relates to a flaky soft magnetic powder for use in a magnetic sheet for noise reduction, the sheet being for use in a variety of electronic devices. The present invention also relates to a method of producing the flaky soft magnetic powder.

BACKGROUND ART

Magnetic sheets containing flaky soft magnetic powder have been used in electromagnetic wave absorbers and antennas for radio frequency identification (RFID). In recent years, such a magnetic sheet has also been used in a position detecting device, which is called "digitizer." JP2011-22661A (Patent Document 1) discloses an electromagnetic induction-type digitizer including a pen-shaped position indicator and a panel-shaped position detector wherein a high-frequency signal transmitted from a coil embedded in the tip of the position indicator is read by a loop coil embedded in the position detector, to detect the indicated position.

A sheet serving as a magnetic path for the high-frequency signal is disposed behind the loop coil for enhancing the detection sensitivity. The magnetic path sheet is composed of, for example, a magnetic sheet prepared by orientation of flaky soft magnetic powder in a resin or a rubber, or a sheet prepared by bonding of soft magnetic amorphous alloy foils. In the case of the use of such a magnetic sheet, the entire detection panel can be composed of a single sheet. Thus, the magnetic sheet exhibits detection uniformity superior to that of the sheet of amorphous alloy foil, which may cause poor detection at the bonding portion.

A traditional magnetic sheet contains powder of an Fe—Si—Al, Fe—Si, Fe-Ni, Fe—Al, or Fe—Cr alloy flattened with, for example, an attritor (attrition mill) for the following reasons. As indicated by the "Ollendorff formula," the preparation of a magnetic sheet having high magnetic permeability requires the use of soft magnetic powder having high magnetic permeability, the use of flaky powder having a high aspect ratio in a direction of magnetization for reducing the demagnetizing field, and the filling of the magnetic sheet with soft magnetic powder at high density. In particular, a high aspect ratio is considered an important factor, and thus powder is often flattened with an attritor under conditions for maximizing the aspect ratio.

Japanese Patent No. 4636113 (Patent Document 2) discloses a method of producing a flaky soft magnetic powder having a large major-axis length and a high aspect ratio, the method involving flattening of powder in the presence of a monohydric alcohol having two to four carbon atoms as an organic solvent.

CITATION LIST

Patent Documents

Patent Document 1: JP2011-22661A
Patent Document 2: Japanese Patent No. 4636113

SUMMARY OF INVENTION

According to Patent Document 2 described above, a flaky soft magnetic alloy powder exhibits high magnetic permeability if the powder has a specific coercive force (i.e., an indicator of magnetic properties) and a specific aspect ratio and satisfies the following relation: $D_{50}/(Hc+BD) \geq 1.5$ where $D_{50}$ represents the 50% particle size (μm) of the powder, Hc represents the coercive force (A/m) of the powder, and BD represents a bulk density (Mg/m$^3$) of the powder. These values, however, can significantly vary depending on the flattening conditions. Sendust powder, which contains large amounts of Si and Al components, is much more brittle than pure Fe powder. Thus, excessive flattening of sendust powder tends to reduce the $D_{50}$ of the powder. In contrast, a larger $D_{50}$ of flaky powder requires a longer period of time for thinning. Thus, the bulk density of the powder does not decrease without the progress of flattening.

Coercive force is minimized in the state of spherical powder, and the coercive force tends to increase in association with the progress of flattening of the powder. Such a variation in coercive force is probably attributed to the distortion of crystal grains by flattening and an increase in oxygen content caused by oxidation of the powder with surrounding moisture. Although the strain of crystal grains can be reduced by heat-treatment, much difficulty is encountered in preventing an increase in the oxygen content of the powder during flattening thereof because a very small amount of moisture reacts with the surface of the powder. For this reason, traditional flaky powder has a limitation in terms of magnetic permeability.

The present inventor has focused on the components of spherical raw material powder, and have found that the coercive force and magnetic permeability of the powder vary depending on the manganese content of the powder. Accordingly, an object of the present invention is to provide a flaky soft magnetic powder that can achieve particularly high magnetic permeability when used for a magnetic sheet. Another object of the present invention is to provide a method of producing the flaky soft magnetic powder.

An aspect of the present invention provides a flaky soft magnetic powder comprising an Fe—Si—Al alloy having an oxygen content of 0.6 mass % or less, a manganese content of 0.1 mass % to 1.0 mass %, and the balance incidental impurities, wherein the flaky soft magnetic powder has an average particle size of 43 to 60 μm and exhibits a coercive force Hc of 106 A/m or less as measured under application of a magnetic field in an in-plane direction of the flaky soft magnetic powder, and the ratio of the tap density to the true density of the flaky soft magnetic powder is 0.17 or less.

The use of the flaky soft magnetic powder satisfying the aforementioned conditions can produce a magnetic sheet for an electromagnetic wave absorber having sufficiently high magnetic permeability. A magnetic permeability μ at high frequencies can be represented by a complex magnetic permeability ($\mu=\mu'-j\mu''$) where $\mu'$ represents a real part and $\mu''$ represents an imaginary part. An increase in the maximum μ value is likely to lead to an increase in $\mu''$ value.

Another aspect of the present invention provides a method of producing the flaky soft magnetic powder, the method comprising the steps of:

preparing a raw material powder by gas atomization or disk atomization technique;

flattening the raw material powder; and heat-treating the flattened powder at 700 to 900° C. under vacuum or in an argon atmosphere.

DESCRIPTION OF EMBODIMENTS

Flaky Soft Magnetic Powder

The flaky soft magnetic powder of the present invention is composed of Fe—Si—Al alloy powder and has an average particle size $D_{50}$ of 43 to 60 µm. An average particle size of less than 43 µm may lead to a difficulty in preparing a flaky powder having high aspect ratio, resulting in reduced real part µ". An excessive large average particle size is not preferred because such a large particle size leads to poor sheet formability. The average particle size $D_{50}$ is preferably 50 to 60 µm, particularly preferably 51 to 58 µm.

The flaky soft magnetic powder of the present invention exhibits a coercive force Hc of 106 A/m or less as measured under application of a magnetic field in an in-plane direction of the flaky powder. A decrease in coercive force within the above range may lead to an increase in magnetic permeability. The coercive force Hc is preferably 90 A/m or less, more preferably 80 A/m or less. The lower limit of the coercive force may be any value, but the coercive force is typically preferably higher than 40 A/m in view of production conditions.

The ratio of the tap density to the true density of the flaky soft magnetic powder of the present invention is 0.17 or less. The ratio of the tap density to the true density is preferably 0.14 or less, more preferably 0.11 or less. The lower limit of the tap density ratio may be any value, but the tap density ratio is typically 0.07 or more. The tap density tends to monotonically decrease with the progress of flattening. A long-term flattening process may lead to a decrease in average particle size and an increase in coercive force.

The flaky soft magnetic powder of the present invention has an oxygen content of 0.6 mass % or less. The oxygen present in the flaky soft magnetic powder is probably in the form of an oxide precipitating at grain boundaries or an oxide at the powder surface. Since either oxide form probably causes an increase in coercive force, an excessively high oxygen content is not preferred. The oxygen content is preferably 0.4 mass % or less, more preferably 0.3 mass % or less. The lower limit of the oxygen content may be any value, but the oxygen content is typically 0.1 mass % or more.

The amount of an oxide precipitating at grain boundaries can be reduced by preventing oxidation in the step of preparing a raw material powder (i.e., spherical soft magnetic powder) and in the step of flattening the raw material powder during the production of the flaky soft magnetic powder. The amount of an oxide at the powder surface can be reduced by preventing oxidation in the flattening step and the heat-treatment step. According to Zener, if the size of crystal grains of a structure does not increase in a normal grain growth model, the driving force of grain growth equals to the pinning force by fine secondary particles, and the crystal grain radius is proportional to the ratio of (the radius of dispersed particles/the volume fraction of the dispersed particles). Although the details are unclear, a low oxygen content probably reduces the pinning effect of an oxide, which inhibits grain growth during heat-treatment, resulting in low coercive force and advantageous magnetic properties.

The flaky soft magnetic powder of the present invention has a manganese content of 0.1 mass % to 1.0 mass %. As described above, the oxygen present in the flaky soft magnetic powder is probably in the form of an oxide precipitating at grain boundaries or an oxide at the powder surface. Although the details are unclear, the present inventors have inferred the effect of manganese as follows: In specific, numerous fine oxides of Fe, Si, and Al are present in traditional flaky sendust powder having a low manganese content. In contrast, flaky powder having an appropriate manganese content preferentially adsorbs oxygen inherently contained in sendust, and the manganese contained in the flaky powder is present in the form of manganese oxide. Thus, the pinning effect is probably reduced, resulting in low coercive force and advantageous magnetic properties. The manganese content is preferably 0.3 mass % to 0.7 mass %, more preferably 0.4 mass % to 0.6 mass %.

Method of Producing Flaky Soft Magnetic Powder

Now will be described the method of producing the flaky soft magnetic powder of the present invention.

<Step of Preparing Soft Magnetic Alloy Powder (Raw Material Powder)>

The flaky soft magnetic powder of the present invention can be prepared by flattening of soft magnetic alloy powder (raw material powder). The soft magnetic alloy powder preferably has low coercive force, and more preferably has high saturation magnetization. In general, an Fe—Si—Al alloy is superior in coercive force and saturation magnetization.

Soft magnetic alloy powder is prepared by any atomization process, such as gas atomization or water atomization. The soft magnetic alloy powder preferably has a low oxygen content. Thus, the soft magnetic alloy powder is preferably prepared by gas atomization, more preferably prepared by use of an inert gas. Although disk atomization can prepare the soft magnetic alloy powder without causing any problem, gas atomization is more preferred from the viewpoint of mass productivity. The soft magnetic alloy powder used in the present invention may have any particle size. The soft magnetic alloy powder may be subjected to classification for adjustment of the average particle size after flattening, removal of particles having high oxygen content, or other productive purposes.

<Flattening Step>

The soft magnetic alloy powder (raw material powder) is then flattened. The powder may be flattened by any known technique using an attritor, a ball mill, a vibration mill or the like. Particularly preferred is an attritor, which has a relatively high ability to flatten the powder. In the case of dry flattening, an inert gas is preferably used. In the case of wet flattening, an organic solvent is preferably used. The organic solvent may be of any type.

The organic solvent is added in an amount of preferably 100 parts by mass or more, more preferably 200 parts by mass or more, relative to 100 parts by mass of the soft magnetic alloy powder. The maximum amount of the organic solvent may be any value. The amount of the organic solvent may be appropriately adjusted in consideration of the balance between productivity and the intended size and shape of the flaky powder. The maximum amount of the organic solvent is typically 500 parts by mass or less. The water content of the organic solvent is preferably 0.002 parts by mass or less relative to 100 parts by mass of the organic solvent for a reduction in the oxygen content of the flaky powder. The organic solvent may be used in combination with a flattening aid. The amount of the flattening aid is preferably 5 parts by mass or less relative to 100 parts by mass of the soft magnetic alloy powder for preventing oxidation. The minimum amount of the flattening aid may be any value, but the amount thereof is typically 0.1 parts by mass or more.

<Heat-Treatment Step>

The flattened soft magnetic powder is then heat-treated. The apparatus for heat-treatment may be of any type. The heat-treatment is preferably carried out at a temperature of 700° C. to 900° C. The heat-treatment performed within such a temperature range can produce flaky soft magnetic powder having reduced coercive force and high magnetic permeability. The flattened powder may be heat-treated for any period of time. The heat-treatment period is appropriately determined in consideration of the productivity or the amount of the powder to be treated. A long-term heat-treatment leads to low productivity. Thus, the heat-treatment period is preferably within five hours.

In the present invention, the flattened soft magnetic powder is preferably heat-treated under vacuum or in an inert gas atmosphere for preventing oxidation. The heat-treatment may be performed in a nitrogen gas atmosphere in view of surface treatment of the powder. The heat-treatment in a nitrogen gas atmosphere, however, may cause an increase in coercive force, resulting in magnetic permeability lower than that in the case of heat-treatment under vacuum.

In some cases, surface-treated powder is desired for improving the insulation of the sheet formed from the powder. Thus, a surface treatment step may optionally be added before, during, or after the heat-treatment step of the powder prepared through the flattening step. For example, the heat-treatment may be performed in an atmosphere containing a small amount of active gas for surface treatment of the powder.

The flaky powder may be subjected to a conventional surface treatment using, for example, a cyan coupling agent for improving the corrosion resistance of the powder or the dispersibility of the powder in rubber.

Method of Producing Magnetic Sheet

A magnetic sheet can be produced from the flaky powder by any conventional process. For example, the flaky powder is mixed with a solution of chlorinated polyethylene in toluene, the mixture is subjected to an application and then drying, and the resultant product is compressed with any press or roll, to produce a magnetic sheet.

EXAMPLES

The present invention will now be described in more detail by way of examples.

Nos. 1 to 21 (Examples)

<Preparation of Flaky Powder>

Powder having a predetermined composition was prepared by a gas atomization or disk atomization process, and then subjected to classification, to prepare raw material powder having a particle size of 150 μm or less. In the gas atomization process, an alloy was molten in an alumina crucible, the molten alloy was discharged through a nozzle (diameter: 5 mm) disposed below the crucible, and high-pressure argon gas was sprayed to the molten alloy. The resultant raw material powder was then flattened with an attritor. In the flattening process with an attritor, SUJ2 balls (diameter: 4.8 mm) were placed in an agitation vessel, the raw material powder and industrial ethanol were added to the agitation vessel, and an agitation blade was rotated at 300 rpm. The industrial ethanol was added in an amount of 200 to 500 parts by mass relative to 100 parts by mass of the raw material powder. No flattening aid was used, or a flattening aid was added in an amount of 1 to 5 parts by mass relative to 100 parts by mass of the raw material powder. The flattened powder and the industrial ethanol were removed from the agitation vessel and transferred to a stainless steel dish, followed by drying at 80° C. for 24 hours. The flattened powder was heat-treated under vacuum or in an argon atmosphere at 700 to 900° C. for two hours, to produce a flaky soft magnetic powder. The flaky soft magnetic powder was evaluated for the properties described below. Table 1 illustrates detailed conditions for preparation of the flaky powder.

<Evaluation of Flaky Powder>

The resultant flaky powder was evaluated for average particle size, true density, tap density, oxygen content, nitrogen content, and coercive force. The average particle size and the true density were determined by laser diffractometry and the gas replacement method, respectively. For evaluation of the tap density, the flaky powder (about 20 g) was placed in a cylinder (volume: 100 cm$^3$), and the filling density was determined under the following conditions (drop height: 10 mm, tapping: 200 times). For determination of the coercive force, the flaky powder was placed in a cylindrical resin container having a diameter of 6 mm and a height of 8 mm, and was subjected to the measurement under magnetization in a height direction and a diametrical direction of the container. Since the thickness direction of the flaky powder corresponds to the height direction of the cylindrical container, the coercive force of the flaky powder in a thickness direction is determined under magnetization in the height direction of the container, and the coercive force of the flaky powder in an in-plane direction is determined under magnetization in the diametrical direction of the container. The coercive force was determined under application of a magnetic field of 144 kA/m.

<Preparation and Evaluation of Magnetic Sheet>

Chlorinated polyethylene was dissolved in toluene, and the flaky powder was dispersed in the solution. The resultant dispersion was applied to a polyester resin (coating thickness: about 100 μm) and dried at ambient temperature and humidity, followed by pressing at 130° C. and 15 MPa, to prepare a magnetic sheet having dimensions of 150 mm by 150 mm by 50 μm (thickness). The volume filling ratio of the flaky powder in the magnetic sheet was about 50%. The magnetic sheet was then cut into a toroidal piece having an outer diameter of 7 mm and an inner diameter of 3 mm. The impedance characteristics of the piece were measured with an impedance meter at room temperature and 1 MHz. The magnetic permeability (real part of complex magnetic permeability: μ') was calculated on the basis of the measured impedance characteristics. The resultant magnetic sheet was embedded in a resin, and a cross section of the sheet was polished. An image of the cross section was captured with an optical microscope. The lengths of the in plane-direction and thicknesses of 50 particles randomly selected from the microscopic image were measured, and the aspect ratio was determined by averaging the measured length/thickness ratios.

Nos. 22 to 40 (Comparative Examples)

A flaky powder was prepared and evaluated and a magnetic sheet was prepared and evaluated as in Nos. 1 to 21, except that the flaky powder was prepared under the conditions illustrated in Table 2.

The present invention should not be limited to the above-described examples. The results of evaluation are illustrated in Tables 1 and 2.

TABLE 1

| No | Raw material powder composition (mass %) | Preparation of raw material powder | Amount of raw material powder/ amount of solvent | Flattening aid (mass %) | Heat-treatment temperature (° C.) | Heat-treatment atmosphere | Average particle size (μm) | Ratio of tap density to true density | Oxygen content (mass %) | Mn content (mass %) | Coercive force in in-plane direction (A/m) | Coercive force in thickness direction (A/m) | Real part of complex magnetic of sheet | Note |
|---|---|---|---|---|---|---|---|---|---|---|---|---|---|---|
| 1 | Fe-9.5Si-.5Al | GA | 0.25 | 0 | 800 | Vacuum | 55 | 0.17 | 0.42 | 0.91 | 82 | 201 | 170 | Examples of the present invention |
| 2 | Fe-9.0Si-6.0Al | GA | 0.25 | 0 | 800 | Vacuum | 44 | 0.15 | 0.51 | 0.90 | 93 | 203 | 168 | |
| 3 | Fe-8.0Si-7.0Al | GA | 0.25 | 0 | 850 | Vacuum | 43 | 0.13 | 0.45 | 0.10 | 88 | 180 | 165 | |
| 4 | Fe-8.0Si-7.0Al | GA | 0.25 | 0 | 800 | Vacuum | 55 | 0.15 | 0.35 | 0.23 | 65 | 163 | 180 | |
| 5 | Fe-8.0Si-7.0Al | DA | 0.25 | 0 | 800 | Vacuum | 55 | 0.15 | 0.40 | 0.35 | 61 | 151 | 179 | |
| 6 | Fe-9.0Si-6.0Al | GA | 0.30 | 0 | 800 | Vacuum | 46 | 0.15 | 0.59 | 0.13 | 98 | 220 | 166 | |
| 7 | Fe-9.0Si-6.0Al | GA | 0.50 | 0 | 800 | Vacuum | 46 | 0.16 | 0.38 | 0.45 | 58 | 118 | 180 | |
| 8 | Fe-9.0Si-6.0Al | GA | 0.50 | 0 | 800 | Vacuum | 46 | 0.14 | 0.55 | 0.70 | 77 | 155 | 175 | |
| 9 | Fe-9.0Si-6.0Al | GA | 0.50 | 0 | 800 | Vacuum | 43 | 0.15 | 0.24 | 0.96 | 71 | 171 | 173 | |
| 10 | Fe-9.0Si-6.0Al | GA | 0.25 | 2 | 800 | Vacuum | 48 | 0.16 | 0.53 | 0.25 | 80 | 203 | 171 | |
| 11 | Fe-9.0Si-6.0Al | GA | 0.25 | 5 | 800 | Vacuum | 49 | 0.14 | 0.34 | 0.31 | 61 | 151 | 179 | |
| 12 | Fe-9.0Si-6.0Al | GA | 0.25 | 0 | 700 | Vacuum | 55 | 0.17 | 0.56 | 0.31 | 79 | 143 | 175 | |
| 13 | Fe-9.0Si-6.0Al | GA | 0.25 | 0 | 740 | Vacuum | 55 | 0.14 | 0.35 | 0.77 | 71 | 144 | 177 | |
| 14 | Fe-9.0Si-6.0Al | GA | 0.25 | 0 | 900 | Vacuum | 55 | 0.16 | 0.49 | 0.55 | 60 | 132 | 184 | |
| 15 | Fe-9.0Si-6.0Al | GA | 0.25 | 0 | 800 | Ar | 51 | 0.16 | 0.59 | 0.85 | 102 | 225 | 168 | |
| 16 | Fe-9.0Si-6.0Al | GA | 0.25 | 0 | 800 | Vacuum | 52 | 0.14 | 0.47 | 0.40 | 55 | 127 | 183 | |
| 17 | Fe-9.0Si-6.0Al | GA | 0.25 | 0 | 800 | Vacuum | 54 | 0.11 | 0.28 | 0.93 | 73 | 168 | 185 | |
| 18 | Fe-9.0Si-6.0Al | GA | 0.25 | 0 | 800 | Vacuum | 54 | 0.13 | 0.43 | 0.63 | 65 | 150 | 185 | |
| 19 | Fe-9.0Si-6.0Al | GA | 0.25 | 0 | 800 | Vacuum | 55 | 0.16 | 0.53 | 0.20 | 88 | 202 | 169 | |
| 20 | Fe-9.0Si-6.0Al | GA | 0.25 | 0 | 800 | Vacuum | 57 | 0.13 | 0.43 | 0.61 | 60 | 138 | 183 | |
| 21 | Fe-9.0Si-6.0Al | GA | 0.25 | 0 | 800 | Vacuum | 59 | 0.14 | 0.35 | 0.81 | 73 | 168 | 180 | |

Note
GA: gas atomization
Note
DA: disk atomization

TABLE 2

| No | Raw material powder composition (mass %) | Preparation of raw material powder | Amount of raw material powder/ amount of solvent | Flattening aid (mass %) | Heat-treatment temperature (° C.) | Heat-treatment atmosphere | Average particle size (μm) | Ratio of tap density to true density | Oxygen content (mass %) | Mn content (mass %) | Coercive force in in-plane direction (A/m) | Coercive force in thickness direction (A/m) | Real part of complex magnetic permeability of sheet | Note |
|---|---|---|---|---|---|---|---|---|---|---|---|---|---|---|
| 22 | Fe-9.5Si-5.5Al | WA | 0.25 | 0 | 800 | Vacuum | 47 | 0.16 | <u>1.30</u> | 0.31 | 106 | 200 | 160 | Comparative Examples |
| 23 | Fe-8.0Si-7.0Al | GA | 0.25 | 10 | 800 | Vacuum | 60 | 0.15 | <u>1.50</u> | 0.30 | <u>115</u> | 268 | 163 | |
| 24 | Fe-9.0Si-6.0Al | GA | 0.25 | 0 | 800 | <u>Air</u> | 55 | 0.15 | <u>2.60</u> | 0.90 | <u>272</u> | 630 | 130 | |
| 25 | Fe-9.0Si-6.0Al | GA | 0.25 | 0 | 800 | Vacuum | 55 | 0.15 | <u>1.40</u> | 0.10 | <u>179</u> | 350 | 153 | |
| 26 | Fe-9.5Si-5.5Al | GA | 0.60 | 0 | 800 | Vacuum | <u>40</u> | 0.16 | 0.51 | 0.20 | 83 | 201 | 159 | |
| 27 | Fe-8.0Si-7.0Al | GA | 0.70 | 0 | 800 | Vacuum | <u>35</u> | 0.14 | 0.55 | 0.45 | 58 | 110 | 159 | |
| 28 | Fe-8.0Si-7.0Al | GA | 1.00 | 0 | 800 | Vacuum | <u>30</u> | 0.15 | 0.58 | 0.55 | 54 | 132 | 160 | |
| 29 | Fe-9.0Si-6.0Al | GA | 0.25 | 0 | 800 | Vacuum | <u>40</u> | 0.09 | <u>1.63</u> | 0.60 | <u>110</u> | 233 | 163 | |
| 30 | Fe-9.0Si-6.0Al | GA | 0.25 | 0 | 800 | Vacuum | <u>35</u> | 0.15 | 0.49 | 0.50 | 65 | 132 | 161 | |
| 31 | Fe-9.0Si-6.0Al | GA | 0.25 | 0 | <u>No thermal treatment</u> | <u>No thermal treatment</u> | 53 | 0.15 | 0.26 | 0.30 | <u>731</u> | 1830 | 110 | |
| 32 | Fe-9.0Si-6.0Al | GA | 0.25 | 0 | <u>500</u> | Vacuum | 53 | 0.15 | 0.45 | 0.20 | <u>339</u> | 655 | 151 | |
| 33 | Fe-9.0Si-6.0Al | GA | 0.25 | 0 | <u>600</u> | Vacuum | 53 | 0.15 | 0.51 | 0.45 | <u>223</u> | 481 | 154 | |
| 34 | Fe-9.0Si-6.0Al | GA | 0.25 | 0 | <u>950</u> | Vacuum | 53 | <u>0.18</u> | 0.55 | 0.31 | <u>185</u> | 493 | 155 | |
| 35 | Fe-9.0Si-6.0Al | GA | 0.25 | 0 | 800 | Vacuum | 49 | <u>0.18</u> | 0.56 | 0.70 | 78 | 131 | 160 | |
| 36 | Fe-9.0Si-6.0Al | GA | 0.25 | 0 | 800 | <u>Nitrogen</u> | 53 | 0.15 | 0.34 | 0.80 | <u>203</u> | 490 | 153 | |
| 37 | Fe-9.0Si-6.0Al | GA | 0.25 | 0 | 800 | Vacuum | 48 | 0.14 | 0.47 | <u>0.01</u> | <u>137</u> | 301 | 159 | |

TABLE 2-continued

| No | Raw material powder composition (mass %) | Preparation of raw material powder | Amount of raw material powder/ amount of solvent | Flattening aid (mass %) | Heat-treatment temperature (° C.) | Heat-treatment atmosphere | Average particle size (μm) | Ratio of tap density to true density | Oxygen content (mass %) | Mn content (mass %) | Coercive force in in-plane direction (A/m) | Coercive force in thickness direction (A/m) | Real part of complex magnetic permeability of sheet | Note |
|---|---|---|---|---|---|---|---|---|---|---|---|---|---|---|
| 38 | Fe-9.0Si-6.0Al | GA | 0.25 | 0 | 800 | Vacuum | 56 | 0.13 | 0.28 | <u>1.50</u> | <u>221</u> | 503 | 158 | |
| 39 | Fe-9.0Si-6.0Al | GA | 0.25 | 0 | 800 | Vacuum | 52 | 0.11 | 0.53 | 0.60 | <u>210</u> | 480 | 155 | |
| 40 | Fe-9.0Si-6.0Al | GA | 0.25 | 0 | 800 | Vacuum | <u>65</u> | 0.11 | 0.53 | 0.60 | 78 | 140 | 150 | |

Note
Underlined numerals and terms fall outside the scope of the present invention
Note
GA: gas atomization
Note
WA: water atomization In Comparative Example No. 22 illustrated in Table 2, the raw material powder is prepared by water atomization. Thus, the flaky powder has a high oxygen content, resulting in no improvement in magnetic permeability. In Comparative Example No. 23, the addition of an excess amount of the flattening aid leads to prolonged flattening time and thus an increase in oxygen content, resulting in no improvement in magnetic permeability. In Comparative Example No. 24, the heat-treatment in an air atmosphere leads to an increase in oxygen content, resulting in no improvement in magnetic permeability. In Comparative Example No. 25, a high oxygen content results in no improvement in magnetic permeability.

In Comparative Example Nos. 26 to 28, the ratio of the amount of the raw material powder to that of the solvent is higher than that in the Examples. This leads to no increase in average particle size, resulting in no improvement in magnetic permeability. In Comparative Example No. 29, the long-term flattening leads to a decrease in average particle size and an increase in oxygen content, resulting in no improvement in magnetic permeability. In Comparative Example No. 30, no increase in average particle size results in no improvement in magnetic permeability. In Comparative Example No. 31, no heat-treatment leads to no reduction in coercive force, resulting in no improvement in magnetic permeability.

In Comparative Example Nos. 32 and 33, a heat-treatment temperature lower than that in the Examples leads to no reduction in coercive force, resulting in no improvement in magnetic permeability. In Comparative Example No. 34, a heat-treatment temperature higher than that in the Examples leads to an increase in tap density/true density ratio and an increase in coercive force caused by agglomeration of powder, resulting in no improvement in magnetic permeability. In Comparative Example No. 35, a flattening period shorter than that in the Examples leads to insufficient flattening of the powder, resulting in no improvement in magnetic permeability. In Comparative Example No. 36, the heat-treatment in a nitrogen atmosphere leads to an increase in coercive force, resulting in no improvement in magnetic permeability.

In Comparative Example No. 37, a manganese content lower than that in the Examples leads to no reduction in coercive force, resulting in no improvement in magnetic permeability. In Comparative Example No. 38, a manganese content higher than that in the Examples leads to no reduction in coercive force, resulting in no improvement in magnetic permeability. In Comparative Example No. 39, a coercive force higher than that in the Examples results in no improvement in magnetic permeability.

In Comparative Example No. 40, an average particle size $D_{50}$ larger than that in the Examples leads to difficulty in forming the sheet. Thus, the flaky powder exhibits poor orientation, resulting in low magnetic permeability. In contrast, the flaky soft magnetic powders of Example Nos. 1 to 21 (i.e., the flaky soft magnetic powders satisfying the conditions according to the present invention) exhibit significantly advantageous effects. That is, the results demonstrate that the use of each of the flaky soft magnetic powders can produce a magnetic sheet for an electromagnetic wave absorber having sufficiently high magnetic permeability.

The invention claimed is:

1. A flaky soft magnetic powder comprising an Fe—Si—Al alloy having an oxygen content of 0.6 mass % or less, a manganese content of 0.1 mass % to 1.0 mass %, and the balance incidental impurities, wherein the flaky soft magnetic powder has an average particle size of 43 to 60 μm and exhibits a coercive force Hc of 106 A/m or less as measured under application of a magnetic field in an in-plane direction of the flaky soft magnetic powder, and the ratio of the tap density to the true density of the flaky soft magnetic powder is 0.17 or less.

2. The flaky soft magnetic powder according to claim 1, wherein the average particle size is 50 to 60 μm.

3. The flaky soft magnetic powder according to claim 1, wherein the coercive force Hc is 90 A/m or less.

4. The flaky soft magnetic powder according to claim 1, wherein the ratio of the tap density to the true density of the flaky soft magnetic powder is 0.11 or less.

5. The flaky soft magnetic powder according to claim 1, wherein the oxygen content is 0.3 mass % or less.

6. The flaky soft magnetic powder according to claim 1, wherein the manganese content is 0.3 mass % to 0.7 mass %.

7. A method of producing the flaky soft magnetic powder according to claim 1, the method comprising the steps of:
preparing a raw material powder by gas atomization or disk atomization technique;
flattening the raw material powder; and
heat-treating the flattened powder at 700 to 900° C. under vacuum or in an argon atmosphere.

8. The method according to claim 7, wherein the flattening step involves wet flattening with an organic solvent, and the organic solvent is added in an amount of 100 parts by mass or more relative to 100 parts by mass of the raw material powder.

9. The method according to claim 7, wherein the flattening step involves the use of a flattening aid in an amount of 5 parts by mass or less relative to 100 parts by mass of the raw material powder.

\* \* \* \* \*